(12) United States Patent
Neuman

(10) Patent No.: US 7,152,176 B2
(45) Date of Patent: Dec. 19, 2006

(54) DYNAMIC RESYNCHRONIZATION OF CLOCKED INTERFACES

(75) Inventor: Darren Neuman, Palo Alto, CA (US)

(73) Assignee: Broadcom Corporation, Irvine, CA (US)

( * ) Notice: Subject to any disclaimer, the term of this patent is extended or adjusted under 35 U.S.C. 154(b) by 498 days.

(21) Appl. No.: 10/717,323

(22) Filed: Nov. 19, 2003

(65) Prior Publication Data

US 2005/0104636 A1 May 19, 2005

(51) Int. Cl.
*G06F 1/12* (2006.01)
(52) U.S. Cl. .................... 713/401; 713/400; 713/500
(58) Field of Classification Search ............... 713/400, 713/401, 500, 501
See application file for complete search history.

(56) References Cited

U.S. PATENT DOCUMENTS

| | | | | |
|---|---|---|---|---|
| 5,332,975 A * | 7/1994 | Young et al. | ............... | 327/107 |
| 5,500,861 A * | 3/1996 | Oppedahl | ................... | 714/731 |
| 5,692,166 A * | 11/1997 | Milhizer et al. | ............ | 713/400 |
| 6,084,930 A * | 7/2000 | Dinteman | ................... | 375/354 |
| 6,166,821 A * | 12/2000 | Blumer | ....................... | 358/1.1 |
| 6,208,184 B1 * | 3/2001 | Demicheli et al. | .......... | 327/161 |
| 6,668,029 B1 * | 12/2003 | Koslov et al. | .............. | 375/350 |
| 6,700,409 B1 * | 3/2004 | Parkin | ........................ | 326/93 |
| 6,765,973 B1 * | 7/2004 | Miller et al. | ................. | 375/354 |
| 2003/0063698 A1 * | 4/2003 | Bonthron et al. | ........... | 375/359 |
| 2004/0239388 A1 * | 12/2004 | Lee | ............................. | 327/158 |

* cited by examiner

*Primary Examiner*—Thomas Lee
*Assistant Examiner*—Malcolm Cribbs
(74) *Attorney, Agent, or Firm*—McAndrews, Held & Malloy, Ltd.

(57) ABSTRACT

One or more methods and systems of resynchronizing or dynamically retuning a clock signal over a high speed clocked data interface are presented. In one embodiment, the system and method utilizes first and second delay lines, a first pair of digital logic devices to generate a first data sequence, a second pair of digital logic devices to generate a second data sequence, a memory, a set of software instructions resident in the memory, a processor, and a user interface. The first and second data sequences are input into a digital logic circuit that compares the two sequences and generates an output. The output is clocked into a digital logic device to generate an indicator signal that is used to resynchronize or dynamically re-tune the clock signal.

42 Claims, 5 Drawing Sheets

DYNAMIC RESYNCHRONIZATION OF CLOCKED INTERFACES

BACKGROUND OF THE INVENTION

As digital integrated circuits function at higher frequencies, the timing of various signals used for clocking data becomes extremely critical. For example, appropriately timed clock signals must be used in order to properly transfer data that is accessed from a digital integrated circuit such as a dynamic random access memory (DRAM). In a read operation, for example, a particular data provided by the DRAM may be valid over a time interval, and as a consequence, must be clocked before the data changes or becomes invalid. As a circuit's frequency of operation increases, it becomes increasingly more difficult to insure that the clock signals are accurately timed for clocking data over a high speed interface.

The timing of clock signals may be influenced, for example, by the conductive path distances these signals must traverse within a printed circuit board. Often, the path a signal travels in a printed circuit board may involve distances that result in delays that vary over time. The electrical characteristics of one or more components on the printed circuit board may have an influence on signals such as timing signals as a function of time. Furthermore, variations in environmental factors such as temperature may have a significant effect on the electrical characteristics of one or more electrical components that influence the behavior of these signals.

When one or more data streams are inappropriately timed to their associated clock signals, a number of errors may result. These timing errors may cause functional or operative failures.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Aspects of the invention provide for a system and method to dynamically re-tune or resynchronize a clock signal to its corresponding data stream over a clocked data interface.

In one embodiment, a method of resynchronizing a clock signal to a data stream comprises receiving the clock signal by a first delay line such that the clock signal has a frequency equivalent to one-half the frequency of the data stream. The method further comprises receiving the clock signal by a second delay line and generating a first delayed clock signal from the first delay line using a first control signal, in which the first control signal effects a first delay such that the first delayed clock signal is characterized by a level transition that is aligned at the midpoint of a valid data period of the aforementioned data stream. The method further comprises generating a second delayed clock signal from the second delay line using a second control signal, in which the second control signal used to effect a second delay to the second delayed clock signal. The method further comprises clocking the data stream using a first pair of first digital logic devices to generate a first data sequence or first set of bits, in which the clocking is performed using the first delayed clock signal. The method further comprises clocking the data stream using a second pair of first digital logic devices to generate a second data sequence or second set of bits, in which clocking is performed using the second delayed clock signal. The method further comprises applying a function to the first data sequence or first set of bits and the second data sequence or second set of bits to generate an output. The method further comprises clocking the output using a digital logic device to generate an indicator in which the clocking is performed by the first delayed clock signal. The method further comprises evaluating the indicator.

In one embodiment, a system for resynchronizing a clock signal to a data stream over a data interface comprises a first delay line that outputs a first delayed clock signal, in which the first delay line is capable of receiving a first control signal. The first control signal effects a first delay such that the first delayed clock signal is characterized by a level transition aligned at the midpoint of a valid data period of the data stream. The system further comprises a second delay line that outputs a second delayed clock signal, in which the second delay line is capable of receiving a second control signal. The second control signal is used to effect a second delay to the second delayed clock signal. The system further comprises a first pair of registers used to generate a first data sequence or first set of bits, in which the first pair of registers is clocked by the first delayed clock signal. The system further comprises a second pair of registers used to generate a second data sequence or second set of bits, in which the second pair of registers is clocked by the second delayed clock signal. The system further comprises a digital logic circuit used to apply a function to the first data sequence and the second data sequence. Thereafter, a digital logic device is configured to generate an indicator signal, in which the digital logic device is clocked by the first delayed clock signal.

These and other advantages, aspects, and novel features of the present invention, as well as details of illustrated embodiments, thereof, will be more fully understood from the following description and drawings.

DETAILED DESCRIPTION OF THE INVENTION

Aspects of the present invention may be found in a system and method to resynchronize or retune a signal used to clock a data stream over a data interface. The system and method may be applied to any data interface providing one or more clock signals used to clock one or more corresponding data streams. The system and method periodically resynchronizes clock signals to their respective data streams using one or more configurable delay lines such that the clock signals have a level transition within the middle of valid data periods of the corresponding data streams. The system and method periodically performs the resynchronization during normal operation of the interface to account for timing variations effectuated by changing electrical or environmental conditions. For example, a temperature variation of an electrical interface may influence the temporal position of the clock signal relative to its data stream. As a result, aspects of the invention provide a dynamic adjustment or continuous re-tuning of a clock signal relative to its data stream.

Aspects of the present invention may be applied to an exemplary DDR (double data rate) interface used in a read operation of a DDR DRAM (dynamic random access memory). The interface provides a data path in which data accessed from a DRAM may be transported to a data bus within a computing device. In general, the system and methods used in accordance with the present invention may benefit any high speed clocked interface. The system and method may be applied to, for example, the following clocked interfaces: DDR interfaces within ASIC devices; DDR interfaces within DRAM devices; SDRAM interfaces within ASIC devices; SDRAM interfaces within DRAM devices; SER-DES (serial/de-serial high speed synchronous ports); SATA (serial ATA); USB; FireWire (IEEE 1394); quad (4×) data rate interfaces, and octal (8×) data rate interfaces.

Figure 1:
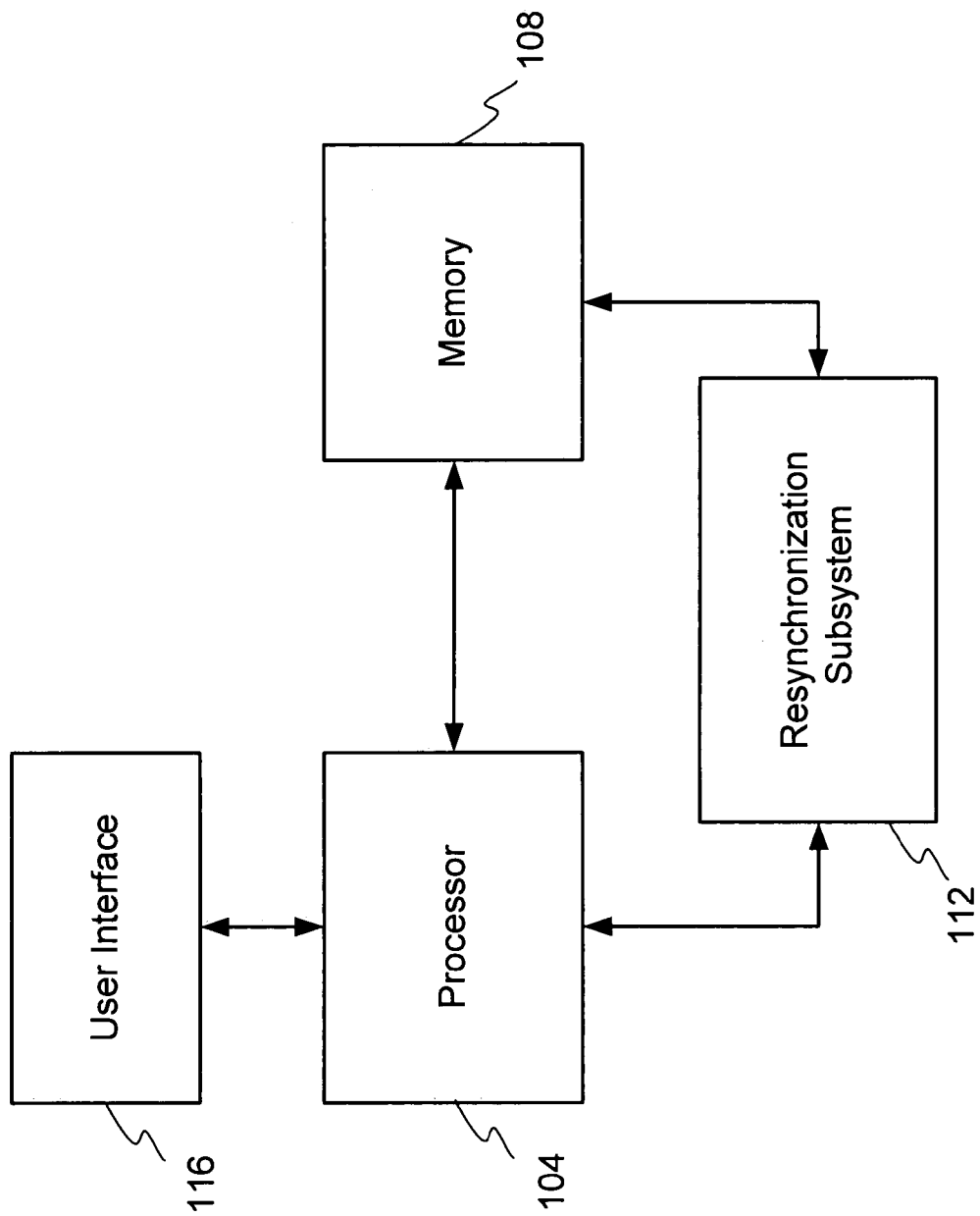
FIG. 1 is a relational block diagram of a resynchronization system used to re-align or re-center a clock signal to a data stream in accordance with an embodiment of the invention.

FIG. 1 is a relational block diagram of a resynchronization system used to re-align or re-center a clock signal to a data stream in accordance with an embodiment of the invention. The resynchronization system comprises a processor 104, a memory 108, a resynchronization subsystem 112, and a user interface 116. The processor 104 interacts and processes data it receives from the memory 108, the resynchronization subsystem 112, and the user interface 116. The processor 104 may execute a software program(s) stored in the memory 108. The software program may comprise a set of instructions resident in memory 108 that may be executed by an input provided by a user through the user interface 116. The user interface 116 may provide control of the processor 104. The software program may employ test information provided by the resynchronization subsystem 112 in determining one or more delay values used for appropriately configuring one or more delays lines used in resynchronizing the data interface.

Figure 2:
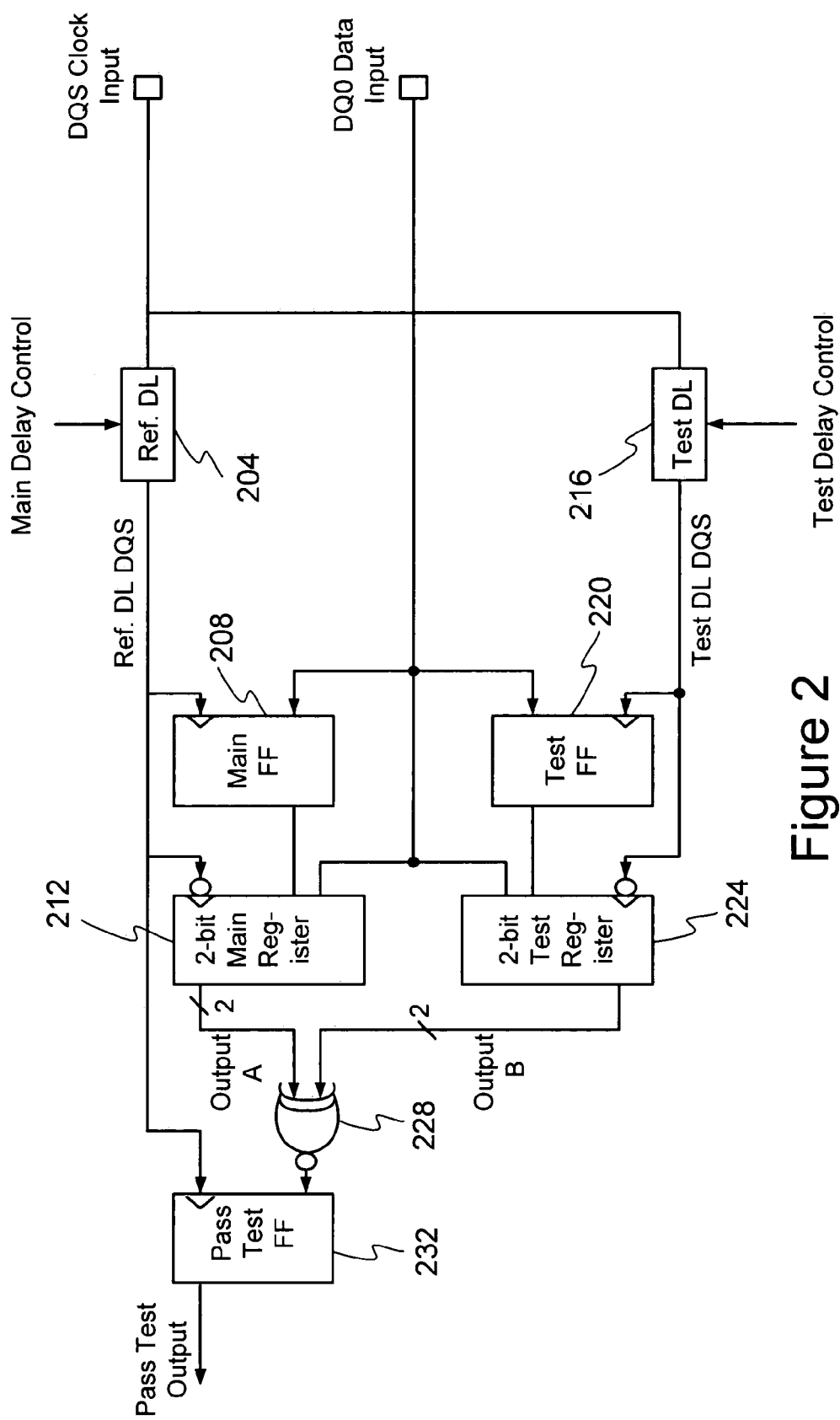
FIG. 2 is a block diagram of the resynchronization subsystem described in connection with FIG. 1, in accordance with an embodiment of the invention.

FIG. 2 is a block diagram of the resynchronization subsystem described in connection with FIG. 1, in accordance with an embodiment of the invention. The subsystem may be used as part of an interface between an exemplary DDR DRAM and an exemplary data bus of a computing device. As shown, a clock input labeled DQS Clock Input is provided as a clocking source to the subsystem under consideration while a serial data input labeled DQ0 Data Input provides a data stream. In this embodiment, the frequency of the clock signal is such that DQS Clock Input is one-half the frequency of the serial data input, DQ0 Data Input. It is contemplated that a common master clock may be used to generate the clock signal and the data stream. The subsystem comprises two delay lines—a first delay line termed a reference delay line (Ref. DL) 204 and a second delay line termed a test delay line (Test DL) 216. The clock signals output by these delay lines 204, 216 are used to clock the data stream using two pairs of registers (or two flip-flop/ register pairs) by way of a two stage approach. The first stage latches a first set of bits using a positive trigger of the outputs of the delay lines 204, 216, while the second stage latches a second set of bits using a negative transition of delayed clock signal. A flip-flop/register pair may be termed a pair of digital logic devices. Of course, the number of bits latched in each stage depends on the number of bits used in the flip-flop or register. The reference delay line 204 receives a main delay control input that is used to configure the delay provided by the reference delay line 204. Likewise, the test delay line 216 receives a test delay control input that is used to configure the delay provided by the test delay line 216. In one embodiment, the delay lines 204, 216 comprise selectable delay lines such as numerically controlled delay lines (NCDL) or voltage controlled analog delay lines. The resynchronization subsystem comprises three flip-flops 208, 220, 232, two 2 bit registers 212, 224, and a digital logic circuit 228. The two 2 bit registers 212, 224, comprise a 2 bit main register 212 and a 2 bit test register 224. The term main is used to signify the one or more flip-flops or registers used in an exemplary data path of an exemplary DDR interface. The term test is used to signify the devices within the resynchronization subsystem used to determine the delay adjustment (or main delay control signal) of the reference delay line. The three flip-flops 208, 220, 232 are termed a main flip-flop 208, a test flip-flop 220, and a pass test flip-flop 232. In this embodiment, the main flip-flop 208 is used to clock in a first bit of an incoming data stream, referred to as DQ0 Data Input. The 2 bit main register 212 is used to clock in a second bit of the DQ0 Data Input. A positive clock transition is used to clock in the first data bit into the positively triggered main flip-flop 208 while a negative clock transition is used to clock in the first and second data bits into the negatively triggered 2 bit main register 212. Alternatively, in another embodiment, a negative clock transition may be used to clock in the first data bit into a negatively triggered main flip-flop 208 while a positive clock transition is used to clock in the first and second data bits into a positively triggered 2 bit main register 212. As shown, the output of the 2 bit main register 212 is denoted as output A. Output A may be described as a data sequence or first set of bits comprising 2 bits that is generated by a clock signal delayed by the reference delay line 204. The clock signal delayed by the reference delay line 204 is termed Reference DL DQS, as illustrated, and is characterized by a level transition that is aligned at the midpoint of a valid data period of the data stream. It is contemplated that Output A represents data that is transmitted to a typical data bus of a computing device during an exemplary DDR DRAM read operation.

The reference delay line 204 is initially used to center-align the DQS Clock Input such that the positive level transition of the DQS Clock Input occurs at the center or midpoint of a data period of a data stream. The reference delay line 204 may be pre-configured with a main delay control initial value to insure that the positive level transition of the DQS Clock Input occurs close to or near the center of the data period when the computing device is initially powered up. The main delay control initial value may be stored within memory of the resynchronization system described in FIG. 1.

The test delay line 216 is used as a delay mechanism to determine a "temporal window" in which the DQS Clock Input signal may be shifted relative to the incoming DQ0 Data Input. Delays used by the test delay line 216 are monitored with respect to whether the clock signal provided by the DQS Clock Input adequately samples the data stream provided by the DQ0 Data Input. The test flip-flop 220 is used to clock in a first bit of an incoming data stream, referred to as DQ0 Data Input, while the 2 bit test register 224 is used to clock in a second bit of the DQ0 Data Input. A positive clock transition is used to clock in the first data bit into the test flip-flop 220 while a negative clock transition is used to clock in the first and second data bits into the 2 bit test register 224. The configuration of flip-flops 208, 220 and registers 212, 224 allows the first bit to be concatenated to the second bit by way of a negative transition clock pulse at each of the 2 bit registers. As shown, the output of the 2 bit test register 224 is denoted as output B. Output B may be described as a data sequence or second set of bits comprising 2 bits that is generated by Test DL DQS. Test DL DQS represents the DQS Clock Input delayed by the test delay line 216. The test delay line 216 incorporates a test delay control signal that configures the delay. The test delay control signal or the main delay control signal may comprise one or more digital signals or an analog voltage.

A Pass Test output or acceptability indicator generated by the Pass Test flip-flop 232 is used to determine whether the sequence of bits clocked in by the Reference DL DQS signal is identical to that of the sequence of bits clocked in by a Test DL DQS signal. As shown, the Reference DL DQS is the delayed clock signal generated by the reference delay line 204 while the Test DL DQS is the delayed clock signal generated by the test delay line 216. The pass test output or acceptability indicator is generated by sampling the result of applying an EXCLUSIVE NOR function of the corresponding bits of Output A and the corresponding bits of Output B. If any EXCLUSIVE NOR of a corresponding bit pair results in a logical low value, the input to the pass test flip-flop should be a logical low value. It is contemplated that the corresponding bit pairs (i.e., from MSB to LSB) are input into two input EXCLUSIVE NOR gates. The outputs of these two input EXCLUSIVE NOR gates are then input into one or more AND gates such that a disparity of one corresponding bit pair generates a low output. Hence the digital logic circuit 228 illustrated in FIG. 2 may comprise two EXCLUSIVE NOR gate outputs that are input into an AND gate. As illustrated, the main flip-flop 208, the 2 bit main register 212, and pass test flip-flop 232 are clocked by the Reference DL DQS clock signal while the test flip-flop 220 and the 2 bit test register 224 are clocked by the Test DL DQS clock signal. As illustrated, the delay applied by the reference delay line 204 is controlled by a main delay control input while the test delay line 216 is controlled by a test delay control input. When the delay employed by the test delay line is acceptable for a particular DQS Clock Input period, the sequence of bits generated by Output A is identical to that of the sequence of bits generated by Output B. The pass test output or acceptability indicator generates a logical high value when the sequence of bits of Output A equals the sequence of bits of Output B.

The range of delays provided by the test delay line 216 provides a way to determine an average delay that may be used to configure the reference delay line 204. For example, the test delay control may sweep a range of delay values as the pass test signal is monitored. In this embodiment, the positive level transition of the DQS Clock Input clock signal is used as a reference point in relation to the data stream signal, DQ0 Data Input. The positive level transition is aligned at the center of a valid data period of the data stream signal. The DQS Clock Input may be experimentally delayed over a range of test delay values while the pass test signal generated by the pass test flip-flop 232 is monitored. For example, if the test delay control is varied such that the following exemplary delay values {−3, −2, −1, 0, 1, 2, 3, 4, 5} generate an acceptable pass test signal, the main delay control may be set to the median or average value. In this instance, the median or average value equals the value 1. As a consequence, the delay provided by the reference delay line 204 may be continuously adjusted so that the positive level transition is centered within the "data eye" of a valid data period of the DQ0 Data Input. The resolution of the delay control (i.e., main delay control and test delay control) and the number of pass test samples observed before a corrective adjustment is made to the main delay control may have an effect on the accuracy of the delay adjustment applied to the main delay control.

The embodiment illustrated in FIG. 2 describes a sample embodiment in which an interface may be dynamically re-tuned or resynchronized by adjusting a delay of a clock signal relative to its corresponding data stream. It is contemplated that the software program previously described in relation to FIG. 1 may be implemented in order to analyze the results of the pass test output before an adjustment is made to the reference delay line by way of the main delay control. The software program may tabulate one or more values from the resynchronization subsystem and employ a number of decision variables prior to determining an appropriate delay for the reference delay line shown in FIG. 2. In one embodiment, the software program may tabulate values over a period of time (i.e., a number of sample periods) as determined by way of input provided by a user before a delay is calculated.

The embodiment of FIG. 2 may be generalized to any number of data streams over any high speed interface in which resynchronization is required. Hence, in a preferred embodiment, the flip-flops 208, 220 may be replaced by n-bit registers. For example, the main and test flip-flops 208, 220 of FIG. 2 may be replaced with 8 bit registers while the main and test 2 bit registers 212, 224 may be replaced with 16 bit registers. The exemplary 8 bit register may receive 8 data streams labeled DQ0–DQ7 (i.e., data streams DQ[7:0]). In this instance, the interface implements an 8 bit (one byte) mapping from an exemplary DRAM to a 16 bit (2 byte) bus and an evaluation of a pass test output may be performed every 16 bits or 2 bytes. In addition, the embodiment of FIG. 2 may be generalized to an implementation utilizing two registers (termed a pair of digital logic devices) to concatenate a first set of bits to a second set of bits provided by a number of parallel data streams. The concatenation, for example, may be performed by clocking in the first set of 8 bits by way of a positive transition of the clock signal. The second set of 8 bits is concatenated to the first set of 8 bits using a negative transition of the clock signal. In this embodiment, the digital logic circuit that was previously implemented in FIG. 2 may comprise 16 two input EXCLUSIVE NOR gates connected to digital circuitry that implements an AND function over all 16 EXCLUSIVE NOR outputs. It is contemplated that the digital circuitry may comprise one or more AND gates. Corresponding bits are input into the two input EXCLUSIVE NOR gates. The outputs of these two input EXCLUSIVE NOR gates are then input into the one or more AND gates such that a logical low value at any EXCLUSIVE NOR output generates a logical low value at the input of the pass test flip-flop depicted in FIG. 2.

In one embodiment, FIG. 2 may be generalized to implement a quad or octal data rate data interface. In order to implement a quad or octal data rate interface, the flip-flops 208, 220 and the main and test 2 bit registers 212, 224 may be replaced by a number of digital logic devices. For example, a quad data rate interface may be implemented using a chain of four flip-flops and/or registers in order to output four bits at Output A and Output B for every one DQS Clock Input period. Likewise, a quad data rate interface may be implemented using a chain of eight flip-flops and/or registers in order to output eight bits at Output A and Output B for every one DQS Clock Input period. Yet, in another embodiment, the data may be clocked using a clock signal that is twice the rate of the DQS Clock Input described in FIG. 2 in order to implement a quad data rate interface. In order to implement an octal data rate interface, the data may be clocked using a clock signal that is four times the rate of the DQS Clock Input described in FIG. 2. It is contemplated that a suitable phase locked loop (PLL) is used to generate the higher data rate clock signals.

Figure 3:
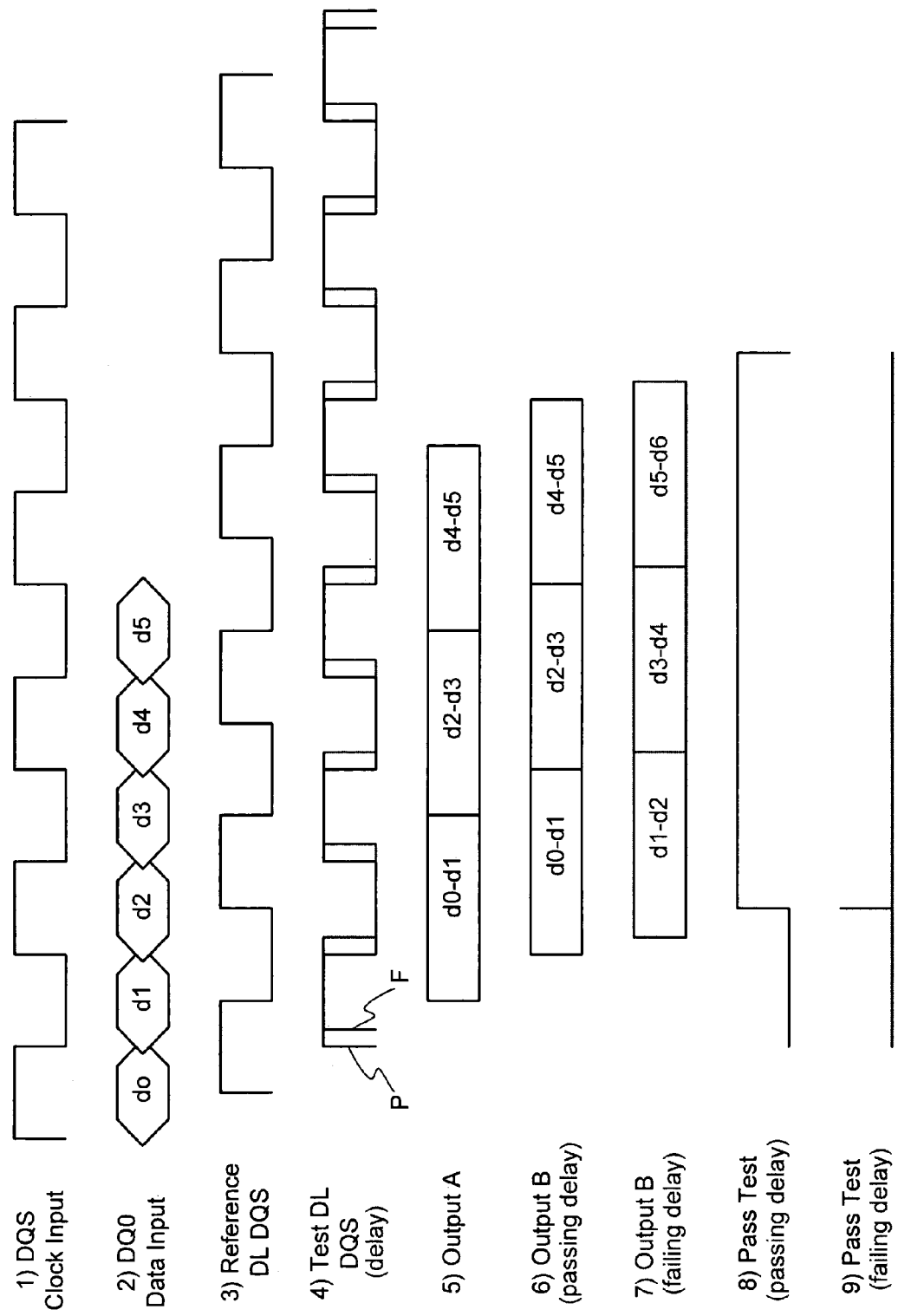
FIG. 3 illustrates a number of timing diagrams associated with the subsystem described in FIG. 2 in accordance with an embodiment of the invention.

FIG. 3 illustrates a number of timing diagrams associated with the subsystem described in FIG. 2 in accordance with an embodiment of the invention. For the sake of simplicity, the timing diagrams correspond to the exemplary embodiment of FIG. 2, in which, the pass test output varies every two data bits. In another embodiment, additional bits may be clocked into the resynchronization subsystem by way of parallel data streams such that the pass test output varies based on the number of data bits shifted into the two stage registers per clock (i.e., DQS Clock Input) cycle. Timing diagram #1 represents the DQS Clock Input described in FIG. 2. The DQS Clock Input is pictured as a typical square wave clock signal. Timing diagram #2 represents the DQ0 Data Input. The data values change every half cycle of the DQS Clock Input waveform. For example, the data values, d0 and d1, occur in one DQS Clock Input period. Timing diagram #3 refers to the Reference DL DQS signal output by the reference delay line. Timing diagram #4 refers to the Test DL DQS signal output by the test delay line. As illustrated in the fourth timing diagram, the Test DL DQS signal may be variably delayed based on the test delay control input provided to the test delay line. Timing diagram #4 illustrates two possible delayed clock signals of the Test DL DQS signal, based on the incorporation of two different delays configured by the test delay control. The two delayed clock signals of the fourth timing diagram are labeled P and F. As shown in FIG. 3, F is further shifted in time compared to P. Timing diagram #5 represents Output A while the timing diagram #6 represents Output B. As one refers to the subsystem described in FIG. 2, Output A and B correspond to outputs provided by two 2 bit registers. The output B shown in timing diagram #6 represents data generated by waveform P as described in the fourth timing diagram. Both Output A and Output B each generate 2 bit outputs from their respective 2 bit registers. Timing diagram #7 represents the case when Test DL DQS signal is time shifted or delayed beyond the time interval corresponding to valid d0 data. In this instance, the delay applied to Test DL DQS is such that d0 is not clocked or sampled. As a consequence, d0 is missing as illustrated in the seventh timing diagram. The timing diagram of Output B shown in the seventh timing diagram represents data generated by clock F as was described in relation to the fourth timing diagram. Timing diagrams 8 and 9 correspond to the output of the pass test flip-flop shown in FIG. 2. In the eighth timing diagram, the pass test indicates that the delay incorporated at the test delay line is acceptable. As a consequence, the pass test output corresponds to a logical high value. In accordance with the embodiment shown in FIG. 2, the test delay employed by the test delay line generates a logical high value for the pass test output if the corresponding bits of Output A and Output B are equal when a positive level transition of the Reference DL DQS occurs. The pass test output changes every time the pass test flip-flop is sampled at its clock input by Reference DL DQS. Hence, in the embodiment of FIG. 2, the pass test output sampling occurs according to Reference DL DQS. In the ninth timing diagram, the pass test indicates that the delay used by the test delay line is unacceptable. The pass test output will fail to attain a logical high value because the 2 bits corresponding to Output A may not equal the 2 bits corresponding to Output B. As a consequence, one or more clocks of Ref. DL DQS will result in a non-logical high output of the pass test flip-flop. A, glitch or unstable waveform is depicted in the ninth timing diagram. The unstable waveform pictured in the ninth timing diagram may occur when the Test DL DQS signal is such that sampling (i.e., a level transition of Test DL DQS) occurs at a data transition point. For example, the ninth timing diagram may result from clocking the data at a point where d0 transitions to d1. Overall, the test delay line may incorporate various delays so as to "sweep" Test DL DQS over a valid data period. As a consequence, a range of acceptable delays over time may be determined by the resynchronization subsystem. The range of acceptable or unacceptable delay values may be processed by the processor executing a software program as described in FIG. 1. The processor may invoke one or more software programs or applications that utilizes test information provided by the resynchronization subsystem in order to determine an appropriate adjustment or correction for the reference delay line. Further, a median or average value for use in adjusting the reference delay line may be determined by execution of the software program or software application.

Figure 4A:
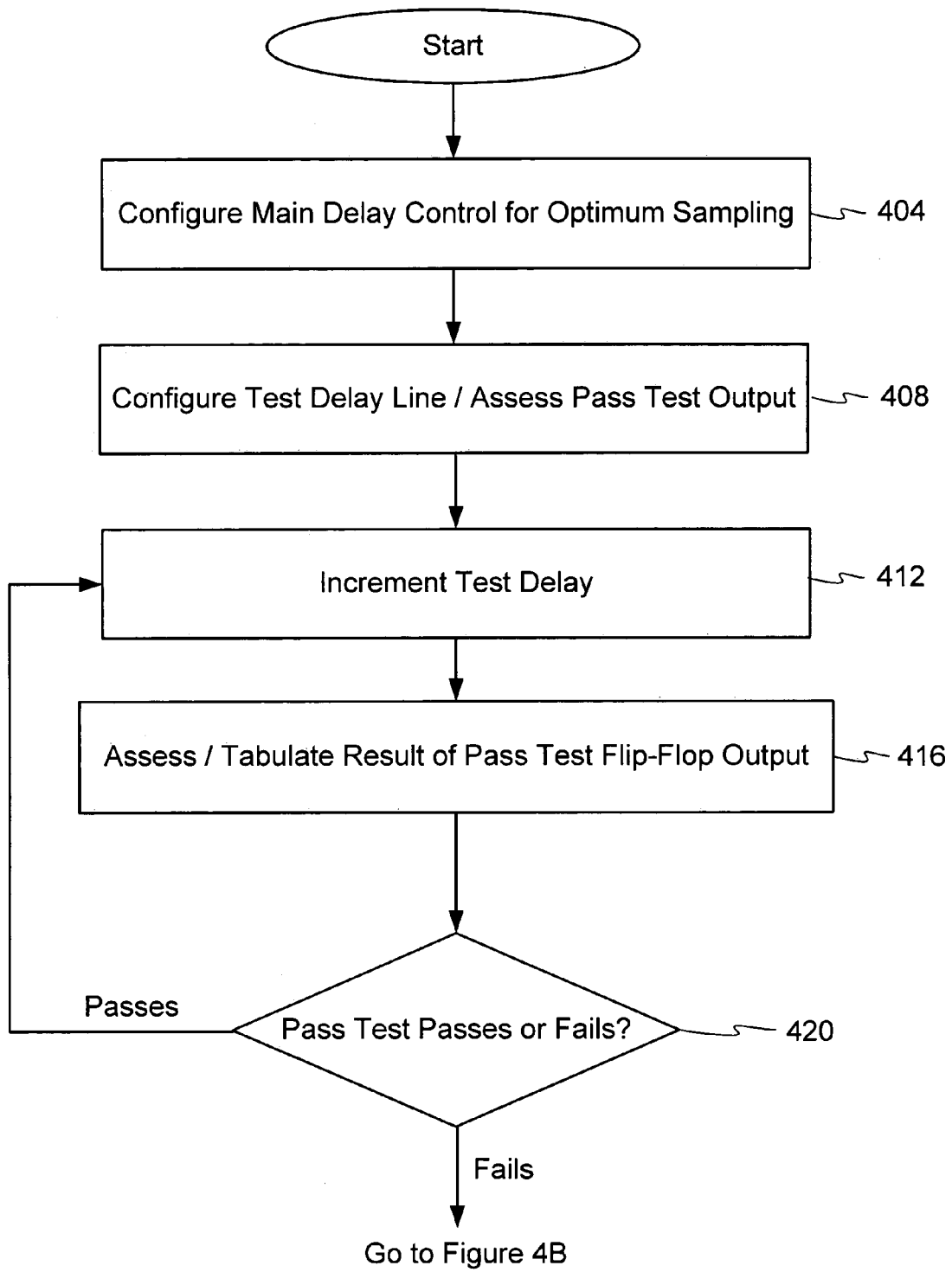
FIG. 4A is an operational block diagram illustrating a method of resynchronizing a clock signal to its data stream in accordance with an embodiment of the invention.
Figure 4B:
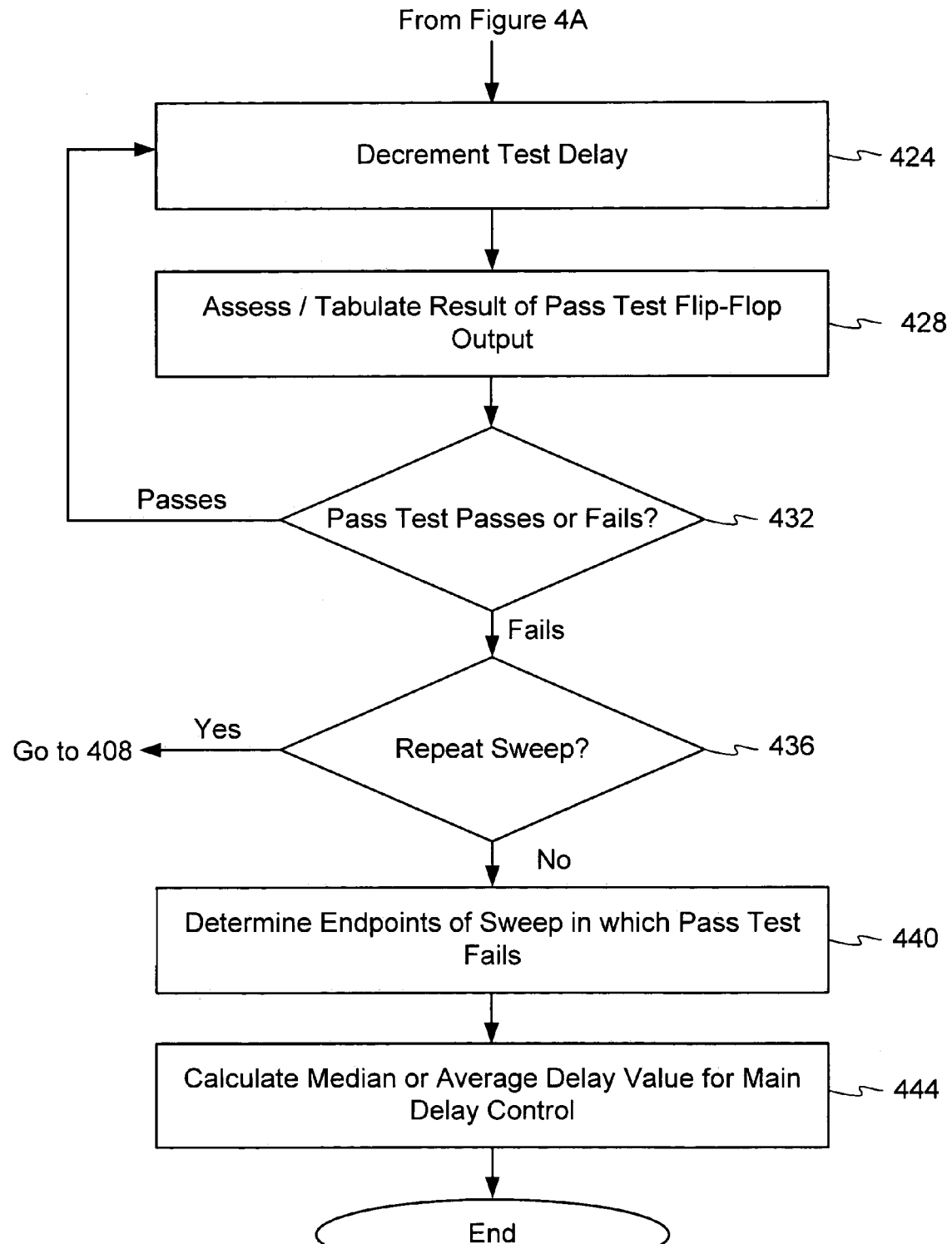
FIG. 4B is an operational block diagram illustrating a method of resynchronizing a clock signal to its data stream in accordance with an embodiment of the invention.

FIGS. 4A and 4B are operational block diagrams illustrating a method of resynchronizing a clock signal to its data stream by dynamically determining a delay value for a delay line of the subsystem described in FIG. 2 in accordance with an embodiment of the invention. The method described in the following steps may be implemented by way of the software program executed by the processor described in the resynchronization system of FIG. 1. At step 404, the main delay control is configured for optimum sampling of the incoming data stream, DQ0 Data Input, prior to operation of the computing device containing the data interface. An initial delay is provided to the reference delay line by way of the main delay control. The value of the initial delay comprises a known default value prior to operation of the computing device. It is contemplated that the default value may be obtained experimentally and stored within the memory of the resynchronization system. The default value may be stored in the software program and used when the computing device is powered up. The initial delay should center the clock signal (i.e., the exemplary DQS Clock Input signal) such that an incoming data stream is clocked or sampled at the center of a valid data period. At step 408, the test delay line is configured by way of the test delay control. The test delay is chosen such that an acceptable pass test results (i.e., the pass test output in this embodiment is a logical high value). For example, Test DL DQS is delayed such that its positive level transition occurs within the valid data period of the data stream. One or more pass test outputs may be sampled for this particular test delay. It is contemplated that the number of samples taken at this particular test delay is controlled by parameters input by a user. The user may store such parameters in the software program stored in memory of the resynchronization system displayed in FIG. 1. At step 412, the test delay is incremented slightly (perhaps by the minimum resolution provided by the test delay control) as the pass test output is determined. Again, the increment used may be determined by the particular parameters configured in the software program. The user may configure the minimum incremental step used in the test delay line. At step 416, the pass test output is analyzed by the processor described in FIG. 1 and the software program may employ a number of decision variables to determine if the sample has properly sampled data within a valid data period.

The software program may store the result of the pass test outcome in memory. At step 420, a determination is made by the software program as to whether the pass test output represents an output that was properly sampled by the delayed clock signal, Test DL DQS. If the pass test output passes or was properly sampled within the valid data period, the process proceeds to step 412, such that the test delay control signal effectuates an additional delay to the Test DL DQS signal. As a result, the pass test output may be sampled using a Test DL DQS signal that is further delayed. The values provided by the test delay control may be controlled by signals generated from the processor described in FIG. 1. If the pass test fails or was improperly sampled outside the valid data period, the process proceeds to step 424, at which the test delay is decremented or decreased. The resynchronization subsystem generates one or more pass test outputs based on the decremented test delay and at step 428, the pass test outputs are analyzed and processed by the processor described in FIG. 1. At step 432, if the pass test output indicates a properly sampled data, the test delay is further decremented and the process continues at step 424. Otherwise, the process goes to step 436. At step 436, a decision is made by the user concerning whether the data clock (DQS Clock Input) should be "re-swept" to further corroborate results. For example, additional pass test outputs may be generated, by returning to step 408, in order to more accurately define the "temporal window" or range of acceptable test delays. If a repeat sweep is not performed, the process continues at step 440. At step 440, the endpoints of the delay sweep (i.e., minimum and maximum test delays) are determined based on the assessed or tabulated results of all pass test outputs. At step 444, a median or average delay value is calculated based on the endpoints. In this embodiment, the median or average value is used to re-align or re-center the corresponding reference delay line. It is contemplated that the aforementioned process may be applied to any n-bit data interface.

In another embodiment, the one or more steps performed by a processor executing the software program stored in memory, as was previously described, may implemented by way of a state machine such as a hardwired or microprogrammed state machine. Values generated for the main delay control and test delay control, analysis of pass test outputs, and generation of median or average delay values from the resynchronization subsystem may be entirely determined by the hardwired state machine. It is contemplated that the hardwired state machine may be used when a data interface does not have access to the processor, memory, and software program described in FIGS. 1, 4A, and 4B. The hardwired state machine may generate one or more values that initially configures the main delay control.

The resynchronization subsystem may generate one or more samples of the pass test output using a particular test delay based on the configuration established by a user. The user may, for example, configure the software program stored in memory with initial values that establish one or more operational parameters or initial values used in the resynchronization process. It is contemplated that the pass test output of FIG. 2 may be analyzed for any number of samples over any duration of time based on a user's preference. The user may, for example, set the number of iterations in which the output pass test is analyzed by way of inputting one or more values into the memory or into the software program as previously discussed in relation to FIG. 1.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A method of resynchronizing a clock signal to a data stream comprising:
   receiving said clock signal by a first delay line, said clock signal having a frequency equivalent to one-half a frequency of said data stream;
   receiving said clock signal by a second delay line;
   generating a first delayed clock signal from said first delay line using a first control signal, said first control signal effecting a first delay such that said first delayed clock signal is characterized by a level transition aligned approximately at a midpoint of a valid data period of said data stream;
   generating a second delayed clock signal from said second delay line using a second control signal, said second control signal used to effect a second delay to said second delayed clock signal;
   clocking said data stream using a first pair of first digital logic devices to generate a first data sequence, said clocking performed using said first delayed clock signal;
   clocking said data stream using a second pair of first digital logic devices to generate a second data sequence, said clocking performed using said second delayed clock signal;
   generating an output based on said first data sequence and said second data sequence;
   clocking said output using a second digital logic device to generate an indicator, said clocking performed by said first delayed clock signal; and
   evaluating said indicator.

2. The method of claim 1 wherein said first digital logic device comprises flip-flops and registers.

3. The method of claim 1 wherein said first digital logic device comprises registers.

4. The method of claim 1 wherein said second digital logic device comprises a flip-flop.

5. The method of claim 1 wherein said second delay is such that the sequence of bits provided by first data sequence is equivalent to the sequence of bits provided by said second data sequence.

6. The method of claim 1 wherein generating an output based on said first data sequence and said second data sequence comprises applying a function to said first data sequence and said second data sequence, and wherein said function is implemented by using of one or more EXCLUSIVE NOR gates connected to one or more AND gates.

7. The method of claim 1 wherein said first pair of first digital logic devices is used to concatenate a portion of said first data sequence to a remaining portion of said first data sequence during a single period of said first delayed clock signal.

8. The method of claim 7 wherein a first flip-flop or register of said first pair of first digital logic devices is sampled by a positive level transition of said first delayed clock signal and a second register of said first pair of first digital logic devices is sampled by a negative level transition of said first delayed clock signal.

9. The method of claim 7 wherein a first flip-flop or register of said first pair of first digital logic devices is sampled by a negative level transition of said first delayed clock signal and a second register of said first pair of first digital logic devices is sampled by a positive level transition of said first delayed clock signal.

10. The method of claim 8 wherein said second pair of first digital logic devices is used to concatenate a portion of said second data sequence, to a remaining portion of said second data sequence during a single period of said second delayed clock signal.

11. The method of claim 10 wherein a first flip-flop or register of said second pair of first digital logic devices is sampled by a positive level transition of said second delayed clock signal and a second register of said second pair of first digital logic devices is sampled by a negative level transition of said second delayed clock signal.

12. The method of claim 10 wherein a first flip-flop or register of said second pair of first digital logic devices is sampled by a negative level transition of said second delayed clock signal and a second register of said second pair of first digital logic devices is sampled by a positive level transition of said second delayed clock signal.

13. The method of claim 1 wherein a logical value of said indicator is used to indicate whether said second delay of said second delayed clock signal is within an acceptable range.

14. The method of claim 1 further comprising tabulating said output using a software program stored in a memory and executed by a processor.

15. The method of claim 1 further comprising incrementing or decrementing said second delay by way of said second control signal in order to establish an acceptable range of said second delay.

16. The meted of claim 15 wherein said incrementing or decrementing is performed by way of a software program executed by a processor.

17. The method of claim 15 wherein said acceptable range is used to determine a median or average value of said second delay.

18. The method of claim 17 wherein said median or average delay value is used to adjust or correct said first delay used in said first delay line.

19. A system for resynchronizing a clock signal to a data stream over a data interface comprising:
a first delay line outputting a first delayed clock signal, said first delay line capable of receiving a first control signal, said first control signal effecting a first delay such that said first delayed clock signal is characterized by a level transition aligned approximately at midpoint of a valid data period of said data stream;
a second delay line outputting a second delayed clock signal, said second delay line capable of receiving a second control signal, said second control signal used to effect a second delay to said second delayed clock signal;
a first pair of registers used to generate a first data sequence, said first pair of registers clocked by said first delayed clock signal;
a second pair of registers used to generate a second data sequence, said second pair of registers clocked by said second delayed clock signal;
a digital logic circuit used to apply a function to said first data sequence and said second data sequence; and
a digital logic device configured to generate an indicator signal, said digital logic device clocked by said first delayed clock signal.

20. The system of claim 19 further comprising:
a memory;
a set of software instructions resident in said memory;
a processor used to execute said software instructions; and
a user interface used to provide control of said processor.

21. The system of claim 19 further comprising a hard-wired or microprogrammed state machine.

22. The system of claim 19 wherein said digital logic circuit comprises one or more AND gates connected to one or more EXCLUSIVE NOR gates.

23. The system of claim 19 wherein said digital logic device comprises a flip-flop.

24. The system of claim 19 wherein said digital logic device comprises a register.

25. The system of claim 19 wherein said indicator is used to establish an acceptable range for said second delay.

26. The system of claim 25 wherein said acceptable range is used to determine a median or average value of said second delay.

27. The system of claim 26 wherein said median or average delay value is used to adjust or correct said first delay.

28. The system of claim 26 wherein said median or average value of said second delay is used to re-align said level transition of said valid data period of said data stream.

29. The system of claim 19 wherein said data interface comprises a DDR interface within an ASIC device.

30. The system of claim 19 wherein said data interface comprises a DDR interface within a DRAM device.

31. The system of claim 19 wherein said data interface comprises a SDRAM interface within an ASIC device.

32. The system of claim 19 wherein said data interface comprises a SDRAM interface within a DRAM device.

33. The system of claim 19 wherein said data interface comprises a SER-DES interface.

34. The system of claim 19 wherein said data interface comprises a SATA interface.

35. The system of claim 19 wherein said data interface comprises a USB interface.

36. The system of claim 19 wherein said data interface comprises a IEEE 1394 interface.

37. The system of claim 19 wherein said data interface comprises a quad data rate interface.

38. The system of claim 19 wherein said data interface comprises an octal data rate interface.

39. The system of claim 19 wherein said first delay line or second delay line comprises a selectable delay line.

40. The system of claim 39 wherein said first delay line or said second delay line comprises a numerically controlled delay line.

41. The system of claim 39 wherein said first delay line or said second delay line comprises a voltage controlled delay line.

42. A system for resynchronizing a clock signal to a data stream comprising:
a first delay line capable of receiving a first control signal, said first control signal effecting a first delay to a first delayed clock signal such that said first delayed clock signal is characterized by a level transition aligned approximately at a midpoint of a valid data period of said data stream;
a second delay line capable of receiving a second control signal, said second control signal used to effect a second delay to a second delayed clock signal;
a first pair of first digital logic devices used to generate a first data sequence, said first pair of first digital logic devices capable of concatenating a portion of said first data sequence to a remaining portion of said first data sequence during a single period of said first delayed clock signal;

a second pair of first digital logic devices used to generate a first data sequence, said second pair of first digital logic devices capable of concatenating a portion of said second data sequence to a remaining portion of said second data sequence during a single period of said second delayed clock signal;

a circuitry used to apply a function to said first data sequence and said second data sequence;

a flip-flop or register configured to generate an indicator signal, said flip-flop or register clocked by said first delayed clock signal.

* * * * *